United States Patent
Schneider et al.

(10) Patent No.: US 6,638,669 B2
(45) Date of Patent: Oct. 28, 2003

(54) THERMAL TRANSFER FILM COMPRISING A REACTIVE POLYMER COMPOSITION FOR LASER-INDUCED COATING

(75) Inventors: Josef Schneider, Diedorf (DE); Andrea Fuchs, Augsburg (DE); Thomas Hartmann, Neusäss-Westheim (DE)

(73) Assignee: MAN Roland Druckmaschinen AG, Offenbach am Main (DE)

(*) Notice: Subject to any disclaimer, the term of this patent is extended or adjusted under 35 U.S.C. 154(b) by 0 days.

(21) Appl. No.: 09/951,106

(22) Filed: Sep. 13, 2001

(65) Prior Publication Data

US 2002/0064717 A1 May 30, 2002

(30) Foreign Application Priority Data

Sep. 15, 2000 (DE) .......................... 100 45 774

(51) Int. Cl.⁷ .......................... G03F 7/34; G03F 7/039; G03F 7/16
(52) U.S. Cl. .......................... 430/17; 430/18; 430/200; 430/201; 430/964
(58) Field of Search .......................... 430/200, 964, 430/201, 17, 18

(56) References Cited

U.S. PATENT DOCUMENTS

| | | | |
|---|---|---|---|
| 4,529,787 A | 7/1985 | Schmidt et al. | 526/317 |
| 5,238,778 A | 8/1993 | Hirai et al. | 430/200 |
| 5,494,774 A | 2/1996 | Ali et al. | 430/200 |
| 5,601,022 A | 2/1997 | Dauer et al. | 101/467 |
| 5,691,103 A | * 11/1997 | Takeyama et al. | 430/200 |
| 5,693,447 A | * 12/1997 | Takeyama et al. | 430/200 |
| 5,856,060 A | * 1/1999 | Kawamura et al. | 430/200 |
| 5,939,231 A | * 8/1999 | Kawamura et al. | 430/200 |

FOREIGN PATENT DOCUMENTS

| | | | |
|---|---|---|---|
| DE | 199 37 478 | 2/2001 | |
| EP | 0 787 777 | 8/1997 | C09C/1/56 |
| EP | 0 844 079 | 5/1998 | |
| EP | 1075963 | * 3/2000 | |

* cited by examiner

Primary Examiner—Richard L. Schilling
(74) Attorney, Agent, or Firm—Cohen, Pontani, Lieberman & Pavane

(57) ABSTRACT

A thermal transfer film or a thermal transfer ribbon includes a substrate layer and a donor layer applied thereto. The substrate layer consists of at least one polymer composition which has mechanical stability at a temperature >150° C. and transmission >70% for light having a wavelength of from 700 to 1600 nm. The donor layer comprises at least the following components: a substance which is able to convert the radiation energy of the incident laser light into heat energy, a polymer which contains acidic groups and/or unsubstituted or substituted amide groups thereof, and optionally a wetting aid. The polymer composition also includes a reactive polymer.

22 Claims, 1 Drawing Sheet

THERMAL TRANSFER FILM COMPRISING A REACTIVE POLYMER COMPOSITION FOR LASER-INDUCED COATING

BACKGROUND OF THE INVENTION

1. Field of the Invention

The invention relates to a thermal transfer film of the generic type comprising a reactive polymer composition which is suitable as donor element for imaging a lithographic printing-plate cylinder, in particular for offset printing, by laser-induced transfer. The invention also relates to a process for the production of the film and to intermediates for this purpose.

2. Description of the Related Art

A printing process is known in which a printing-plate cylinder is provided with plastic in a punctiform and imagewise manner. For an offset process, this printing-plate cylinder is then coated with printing inks, and the printing ink in the ink-carrying areas is taken up by a rubber roll and transferred onto the substrate to be printed. For rapid change of the print motifs, in particular for small runs, it is desired to carry out the operation within an apparatus firstly wherever possible with computer control and secondly without changing movable parts. The printing apparatus presented in U.S. Pat. No. 5,601,022 meets this demand.

The printing-plate cylinder used in the above-mentioned apparatus is covered in a punctiform and imagewise manner with a polymer which originates from a thermal transfer ribbon. In order to obtain a lithographic printing plate which is suitable for offset printing—this means clear separation of the hydrophilic areas (the parts on the printing-plate cylinder which are not covered with polymer) and hydrophobic areas (the parts on the printing-plate cylinder which are covered with polymer and represent the ink-carrying areas later during the printing operation) on the printing-plate cylinder—certain physical and chemical parameters of the thermal transfer film, in particular for a thermal transfer ribbon, must be established and optimized.

SUMMARY OF THE INVENTION

The object of the present invention is to provide an improved thermal transfer film for the imaging of a printing-plate cylinder by laser-induced transfer of a polymer from a donor layer of the thermal transfer film, where the following requirements are to be observed:

1. the support must meet the mechanical requirements of transport, the optical requirements of transmission of a laser beam and the thermal requirements during warming of the applied coating;
2. the coating which is located on the film and is to be transferred in a punctiform and imagewise manner should adhere strongly to the printing-plate cylinder and offer a service life which is adequate for the longest possible run with constant print quality; and
3. it should be possible for the applied polymer on the printing-plate cylinder to be removed in a simple and environmentally friendly manner and rapidly after the printing operation in order that a new printing operation can begin as soon as possible.
4. The polymer composition applied in pixel form should have an ideal cylindrical shape or approximate to this shape.

The above object and further objects revealed in the description below have been achieved by a thermal transfer film including a substrate layer with a donor layer applied thereto. The substrate layer consists of at least one polymer composition which is mechanically stable at a temperature greater than 150° C., and has a transmissivity greater than 70% for light having a wavelength of 700 to 1600 nm. The donor layer includes a substance which is able to convert the radiation energy of the incident light into heat energy, a polymer which contains acidic groups and/or substituted amide groups, and optionally a wetting aid.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
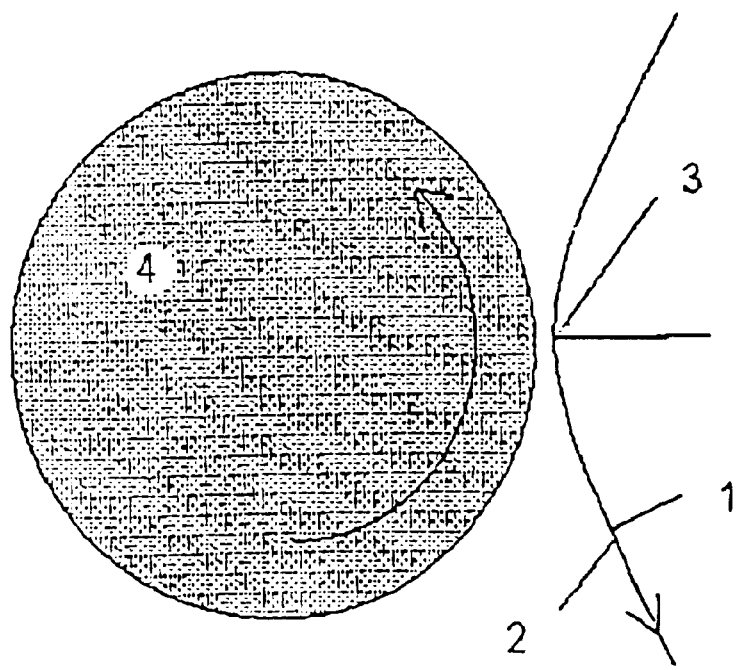
FIG. 1 is a schematic view of a transfer film and a printing plate cylinder.

The thermal transfer film according to the invention consists of a substrate layer 1, for example a support film or a support ribbon, made from a plastic with the highest possible heat resistance, and, applied thereto, a donor layer 2, i.e. the heat-sensitive transferable layer. The action of the laser beam 3 from the back of the thermal transfer ribbon, i.e. from the side of the substrate layer 1 which is uncoated in the sense of a donor layer, induces heat in the donor layer 2 which results in softening and finally in detachment of the plastic layer. Owing to gaseous substances formed, in particular, at the interface 5 between the substrate layer 1 and the donor layer 2 applied thereto, the heat-sensitive donor layer is detached imagewise from the substrate/donor layer laminate in the soft to semi-solid state and transferred onto the plate cylinder 4. In addition, the nature of the application of the ribbon (see U.S. Pat. No. 5,601,022) means that the transfer operation is irreversible and directed. The reactive polymers present initiate immediate curing via the heat action of the laser beam. The plastic cools immediately owing to the high heat capacity of the cylinder, consisting, for example, of metal, and adheres to the printing-plate cylinder. After the entire printing-plate cylinder has been provided with a plastic layer in a punctiform and imagewise manner at high speed by a spiral-shaped application process, the transferred layer is after-treated essentially in two steps, namely in a first step a fixing step is carried out in which the heat action causes, inter alia, the plastic layer to adhere better to the material of the printing plate, and in a second step, in which hydrophilization is carried out, i.e. the areas uncovered on the printing-plate cylinder are hydrophilized all the way through, and simultaneously the profile, i.e. the edge sharpness, of the transferred polymer is rendered sharper. Hydrophilicity in this application means the water friendliness as a measure of the wetting with water under dynamic conditions.

In the unimaged state, the printing-plate cylinder has a surface having hydrophilic properties all the way through.

Suitable for this purpose are, for example, plasma- or flame-sprayed ceramics or metal surfaces, such as chrome, brass (Cu52–65% Zn48–35%, for example Boltomet L® Cu63Zn37) and stainless steels in the sense of high-alloy steels (in accordance with DIN 17440: 1.43xx (xx=01, 10, . . . ), 1.4568, 1.44xx (xx=04, 35, 01 . . . )) etc.

FIG. 1 explains the printing operation. A laser beam 3 hits the back 1 of a thermal transfer ribbon or a thermal transfer film 1, 2. The printing-plate cylinder rotates in the direction indicated. The printing-plate cylinder 4 is imaged in spiral form with material of the donor layer 2.

Figure 2:
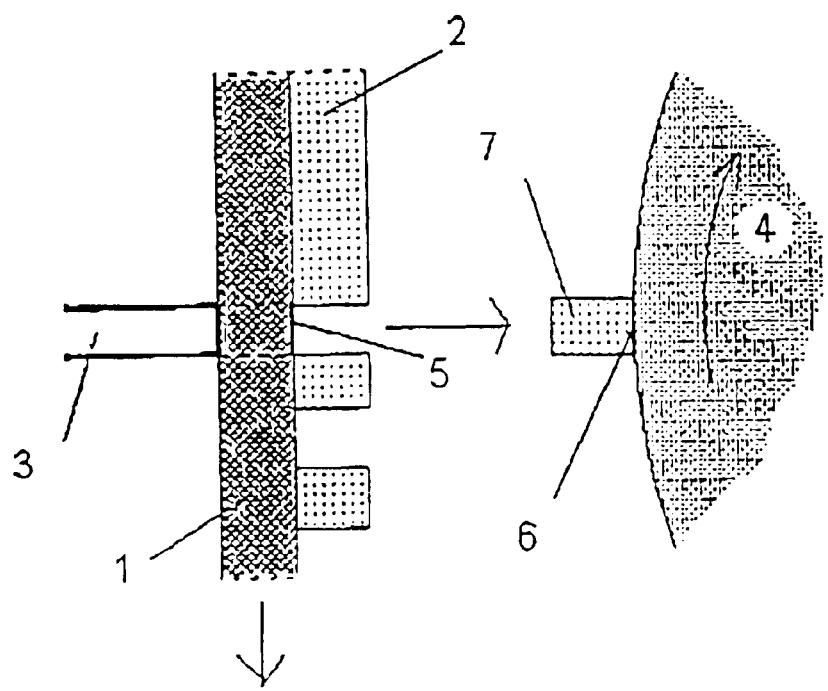
FIG. 2 is a detailed schematic view showing the transfer of the donor layer to form discrete pixels.

FIG. 2 explains the transfer operation in more detail. Polymer particles 7 are detached from the laminate of the donor layer 2 after the laser beam 3 hits the back 1 of the thermal transfer ribbon (or the thermal transfer film) and adhere to the printing-plate cylinder 4. The processes at the interface 5 or 6 are explained in greater detail in the description.

The Substrate Layer

The substrate layer must be resistant to mechanical stresses during the run of the transport device, for example the ribbon station, and under the local effect of heat. The substrate layer must in addition be chemically inert toward the chemicals used in the production of the thermal transfer ribbon. The substrate is preferably optically transparent for the wavelength used for image generation. The substrate should also be neutral to electrostatic charging, but be an electrical insulator.

The thickness of the substrate layer is from 50 $\mu$m to 4 $\mu$m or up to 5 $\mu$m, in particular from 12 to 6 $\mu$m. An optimum is at 7.5 $\mu$m. The parameters determining the thickness are essentially the optical transmission, the mechanical strength, including at elevated temperature, the thermal conductivity and the thermal stability and dimensional stability at elevated temperature, where a compromise should be sought between these parameters. The optical transmission increases with decreasing thickness of the substrate layer. The mechanical strength in turn improves with increasing thickness of the substrate layer. On the one hand, the thermal transmission increases with decreasing thickness. On the other hand, the mechanical stability increases with increasing thickness of the substrate layer.

On the other hand, the thickness of the substrate layer should be sufficient for the heat necessary for the transfer of material of the donor layer to be generated on exposure to a laser having a power of 300 mJ and consequently effective transfer of material of the donor layer takes place.

Besides the thickness, the tensile stress at break likewise plays a role. In particular, the tensile stress at break in the machine direction should be greater than 200 N/mm$^2$, preferably greater than 250 N/mm$^2$, particularly preferably greater than 270 N/mm$^2$. For the transverse direction, it should be greater than 180 N/mm$^2$, preferably greater than 220 N/mm$^2$, in particular greater than 270 N/mm$^2$. The tensile strength is essentially determined by the mechanical stresses through the ribbon station and—depending on the width of the ribbon—by the local exposure to heat.

Another of the important factors for the accuracy of the generation of the image of the printing-plate cylinder is the dimensional stability of the substrate layer under thermal load. At a thermal load of 150° C., the shrinkage should be less than 8%, in particular less than 6.5%, particularly preferably less than 5%. Thermal dimensional stability of the substrate layer is required, in particular, in the following operations:

a) during production, storage and during transport,
b) during adhesion of the donor layer to the substrate layer in the case of different coefficients of expansion and layer thicknesses,
c) during multiple use of the ribbon and the spatial precision required in this case; this is taken to mean the arrangement of a plurality of writing tracks closely adjacent to one another, one writing track being required for the imagewise transfer. The thermal stability of the substrate guarantees the dimensional stability of the ribbon in the case of multiple use, even after transfer operations have already taken place.

The substrate preferably consists of a plastic which has the above-mentioned mechanical properties, even at a temperature of 150° C. or above. In particular, optically transparent, heat-resistant and high-strength plastics are therefore suitable. Polypropylene and PVCP can be used. In particular, however, plastics that can be used are polyesters, polyaryl ether ether ketones (PEEK), polyphenylene ethers (PPE) and/or polycarbonates. Preference is given to polyesters, of which preference is given to polyesters derived from dicarboxylic acids and diols and/or from hydroxycarboxylic acids or the corresponding lactones, such as polyethylene terephthalate, polybutylene terephthalate, poly-1,4-dimethylolcyclohexane terephthalate and polyhydroxybenzoates, as well as block copolyether esters derived from polyethers containing hydroxyl end groups and also polyesters modified with polycarbonates. Also suitable are polyethylenenaphthalene dicarboxylates. Commercially available PET products are, for example, Hostaphan® and Mylar®.

The plastic for the substrate layer should preferably comprise little plasticizer, preferably no plasticizer. Plasticizers are essentially of a low-molecular-weight nature and can therefore evaporate during conversion of the energy of the laser light into heat and result in a plasma effect. A plasma which occurs reflects the penetrating laser beam, meaning that the heat necessary to soften and eject the material to be transferred is no longer achieved in the donor layer. Plasticizers which do not generate a plasma effect on exposure to a laser having a power of 300 mJ with the above-mentioned films or ribbons can be tolerated. The same applies to concentrations of conventional plasticizers.

The highest possible optical transmission is desired for the plastic to be used as substrate layer. The optical transmission is generally determined by the thickness of the ribbon and the choice of material. In addition, the optical transmission is dependent on the wavelength. In general, the wavelength range for IR semiconductor lasers is between 700 and 1600 nm. The ranges are preferably from 800 to 900 nm, in particular from 850 to 820 nm on the one hand and from 1000 to 1200 nm or from 1070 to 1030 nm on the other hand. For an Nd:YAG laser, the wavelength is about 1064 nm. A desirable transmission for the substrate layer is >70% of IR light in the wavelength range from 700 to 1600 nm, more preferably >85%. A transmission of IR light in the wavelength range from 800 to 1100 nm of >85% is particularly preferred. A laser which can be used is a point laser. However, preference is given to IR semiconductor laser diode arrays.

As mentioned above, the substrate must be chemically inert, i.e. the chemicals employed in the process for the production of the thermal transfer ribbon must not adversely affect the substrate. In particular, these are organic solvents, preferably ketones, aliphatic and cycloaliphatic hydrocarbons, as well as acids and bases.

If a film is used in ribbon form, the width of the ribbon is from 3 mm to 50 mm, preferably from 8 mm to 30 mm, in particular from 10 mm to 15 mm.

The Heat-Sensitive and/or Laser-Sensitive Substance

After the laser beam has passed through the substrate layer, it hits the donor layer, i.e. the layer comprising the composition to be transferred. At the interface between the substrate layer and the donor layer, the aim is for light energy to be converted into heat energy in the shortest possible time. For this purpose, it is necessary that the polymer to be transferred comprises an auxiliary substance which supports this operation. In particular, these are substances which absorb the energy of the laser radiation particularly well, in particular in the above-mentioned wavelength ranges, and convert it into heat energy. These substances may be organic dyes or organic colorants, with the proviso that they do not decompose during conversion of light energy into heat energy. Examples of particularly stable organic dyes or pigments are benzothiazoles, quinolines, cyanine dyes or pigments, perylene dyes or pigments, polymethine dyes and pigments, such as oxonol dyes and pigments, and merocyanine dyes and pigments. Commercially available organic dyes or pigments are: KF 805 PINA from Riedl de Haen (a benzothiazole compound), KF 810 PINA from Riedl de Haen (a quinoline compound), ADS840MI, ADS840MT, ADS840AT, ADS890MC, ADS956BI, ADS800WS, ADS96HO from American Dye Source Inc., 3,3'-diethylthiatricarbocyanine p-toluenesulphonate (cyanine dye compounds), perylene-3, 4,8,10-tetracarboxylic anhydride (a perylene compound), as well as Epolite V-63 and Epolite III-178 from Epolin Inc., Newmark. The organic dyes or pigments are employed in an amount of from 5 to 40% by weight, preferably from 10 to 30% by weight, based on the dry weight of the donor layer. These dyes can be used individually or in the form of a mixture in order to shift the absorption maximum into the wavelength range of the laser employed.

Besides organic dyes or organic colorants, inorganic substances are of interest, in particular those which do not decompose during the conversion of light energy into heat energy. Substances of this type are, for example, titanium dioxide, aluminium oxide and other metal oxides, and inorganic coloured pigments. Mention may be made here of magnetite: $Fe_3O_4$; spinel black: $Cu(Cr,Fe)_2O_4$, $Co(Cr,Fe)_2O_4$; manganese ferrite: $MnFe_2O_4$. These substances are employed in an amount of up to 20% by weight.

A special position for substances which are able effectively to convert light energy into heat energy is played by carbon black. The production process enables carbon black to be influenced particularly favourably. In particular, finely divided carbon black having a mean particle size of between 10 and 50 nm, in particular between 13 and 30 nm, and/or having a black value in accordance with DIN 55979 of between 200 and 290, in particular of 250, may advantageously be employed. Carbon blacks are employed in an amount of up to 30% by weight, preferably up to 20% by weight. The above-mentioned substances, namely organic dyes or colorants, inorganic substances which do not decompose during the conversion of light energy into heat energy, and carbon black can be used individually or in the form of a mixture. The amount of heat-sensitive and/or laser light-sensitive substance depends on the ability for the conversion of light energy into adequate heat energy for the transfer of the substance to be transferred which is located on the substrate layer. A suitable carbon black is Conductex.

The Polymer of the Donor Layer

The polymer of the donor layer executes, in particular, the following functions. Firstly, it will rapidly soften on exposure to the laser beam, will develop the necessary pressure at the interface with the substrate layer, and will transfer as a semi-solid graft to the printing-plate cylinder. There, the plastic transferred in this way adheres, owing to hydrophilic groups, to the hydrophilic surface of the printing-plate cylinder. Finally, the polymer should firstly survive a fixing step by warming and then a hydrophilization step of the finished printing-plate cylinder. In this step, the free metal areas of the printing-plate cylinder are hydrophilized, and the plastic areas on the printing-plate cylinder are profiled. In addition, the plastic now located on the printing-plate cylinder should be able to accept printing ink and should have the longest possible service life. Finally, the transferred composition should be rinsed off the printing-plate cylinder in a simple and environmentally friendly manner, i.e. if possible using an aqueous, non-toxic solution, when the printing operation is complete, so that the printing-plate cylinder is available again for the next operation in a very short time. Owing to these requirements, the following preferred demands arise for the polymer. The polymers are soluble in aqueous solution, but insoluble in the fountain solution normally used in offset paper printing. This is best achieved by rendering the polymer water-soluble for a pH differing from the fountain solution. Preference is given to an alkaline range having a pH of greater than 10, preferably 10.5, in particular greater than 11.

In order that the polymer can be detached from the substrate or support 1, its number average molecular weight should preferably not exceed 20,000. On the other hand, its number average molecular weight should preferably not be less than 1000, since otherwise adequate water resistance is not achieved. The range is preferably between 1000 and 15,000, in particular between 1000 and 10,000.

The polymers must accept printing ink. A surface tension of preferably between 50 and 10 mN/m, in particular between 40 and 23 mN/m, particularly preferably in the range from 28 to 32 mN/m, is of importance for this purpose. The surface tension is measured via contact angle measurement with 3+n test liquids and is evaluated by the method of Wendt, Own and Rabel.

In order that the transferred polymer adheres adequately to the hydrophilic printing-plate cylinder, it preferably contains acidic groups. These groups may be selected from the groups —COOH, —$SO_3H$, —$OSO_3H$ and —$OPO_3H_2$ and the unsubstituted or alkyl- or aryl-substituted amides thereof. The alkyl group can have from 1 to 6, preferably from 1 to 4, carbon atoms, and the aryl group can have from 6 to 10, preferably 6, carbon atoms. In addition, the polymer preferably contains an aromatic group. Preference is given to phenyl groups. The polymer preferably originates from the polymerization of α,β-unsaturated carboxylic, sulphonic, sulphuric and phosphoric acids or esters or above-defined amides thereof and styrene, and derivatives thereof, and optionally α,β-unsaturated carboxylic acid esters. The acidic monomers and the aromatic-vinylic monomers should be selected in such a way that the polymer has a glass transition temperature $T_g$ of between 30 and 100° C., in particular between 30 and 90° C., preferably between 55 and 65° C. The polymer preferably has a ceiling temperature in the region of the melting point, the melting range being between 80 and 150° C., in particular between 90 and 140° C., preferably between 105 and 115° C., particularly preferably around 110° C. Copolymers which contain significant proportions of α-methylstyrene have proven less advantageous.

Suitable polymers are found in U.S. Pat. Nos. 4,013,607, 4,414,370 and 4,529,787. Resins disclosed therein can, for example, be dissolved essentially completely if an adequate proportion, for example 80–90%, of these groups is neutralized using an aqueous solution of basic substances, such as borax, amines, ammonium hydroxide, NaOH and/or KOH. For example, a styrene-acrylic acid resin having an acid number of about 190 would contain not less than about 0.0034 equivalent of —COOH groups per gram of resin and would be dissolved essentially completely if a minimum of about 80–90% of the —COOH groups are neutralized by an aqueous alkaline solution. The acid number call be in the range between 120 and 550, 150 and 300, for example 150 to 250. The monomer combinations mentioned below are preferred: styrene/acrylic acid, styrene/maleic anhydride, methyl methacrylate/butyl acrylate/methacrylic acid, α-methylstyrene/styrene/ethyl acrylate/acrylic acid, styrene/ butyl acrylate/acrylic acid, and styrene/methyl acrylate/ butyl acrylate/methacrylic acid. An alkali-soluble resin comprising 68% of styrene and 32% of acrylic acid and having a molecular weight of 500–10,000 may be mentioned. Other resins have an acid number of approximately 200 and a molecular weight of approximately 1400. In general, styrene (α-methylstyrene)-acrylic acid (acrylate) resins have a number average molecular weight of 2500–4500 and a weight average molecular weight of 6500–9500. The acid number is 170–200. Illustrative polymers contain 60–80% by weight of aromatic monoalkenyl monomers and 40–20% by weight of (meth)acrylic acid monomers and optionally 0–20% by weight of acrylic monomer containing no carboxyl groups. Mixtures of from 10:1 to 1:2 or 1:1, preferably from 8.1 to 1:2, for example from 2:1 to 1:2, of styrene/α-methylstyrene can be employed. However, copolymers which comprised significant proportions of α-methylstyrene proved to be less advantageous.

(=epoxy resins) and the crosslinking components (=curing agents) must be matched to one another here with respect to reactivity and functionality.

However, epoxy resins can also be crosslinked directly by polymerization of the epoxide groups.

Epoxide systems (resin/curing agent combinations) are principally used to produce crosslinked polymers. On use of diepoxide compounds with bifunctional addition components, linear, soluble structures can be obtained, and also branched, soluble structures on addition of small amounts of trifunctional components.

Due to the numerous possibilities for combination of resin and curing agent structures, epoxy resin systems are eminently suitable for the targeted setting of material properties: firstly as far as the viscosity and Theological behaviour during processing are concerned, and secondly as far as properties of the target end products are concerned. In addition, targeted addition or incorporation of auxiliary substances, such as fillers, reinforcing materials, flame retardants, flexibilizers, pigments and others, the potential uses are significantly expanded.

In contrast to the soluble, heat-meltable and -processable thermoplastics, crosslinked epoxy resins can no longer be deformed thermally.

Examples of solid epoxy resins are the following:

| Designation | Epoxide content (eq/kg) | Epoxide equivalent weight (g/eq) | Molecular weight | Softening temperature in accordance with DIN 51920 (° C.) | Viscosity at 25° C. in accordance with DIN 53015 (mPa · s) |
|---|---|---|---|---|---|
| semi-solid | 3.70 to 4.35 | 230 to 270 | ~450 | — | 450 to 700[1] |
| solid, type 1 | 1.80 to 2.25 | 450 to 550 | ~900 | 70 to 80 | 160 to 250[2] |
| solid, type 2 | 1.45 to 1.80 | 550 to 700 | ~1100 | 80 to 90 | 280 to 350[2] |
| solid, type 4 | 1.05 to 1.25 | 800 to 950 | ~1500 | 95 to 105 | 450 to 600[2] |
| solid, type 7 | 0.40 to 0.62 | 1600 to 2500 | ~3000 | 120 to 140 | 1500 to 3000[2] |
| solid, type 9 | 0.25 to 0.40 | 2500 to 4000 | ~4000 | 140 to 160 | 3500 to 10,000[2] |
| solid, type 10 | 0.16 to 0.25 | 4000 to 6000 | ~5000 | 150 to 180 | 5000 to 40,000[2] |

[1] 70% in diethylene glycol monobutyl ether
[2] 40% in diethylene glycol monobutyl ether In order to apply the pixels with a cylindrical shape, 1–20%, preferably 7–12% (based on the total polymer content) of reactive, preferably solid polymer are added to the above-mentioned polymer. Reactive polymers are, for example, epoxide, isocyanate or polyvinyl-butyral.

Examples of epoxides are: solid resins based on bisphenol A, such as Araldit GT 6099, Araldit GT 7071 and Araldit GT 7072. Araldit® is a trade mark of Ciba-Geigy for *epoxy resins, casting and impregnation resins in electrical engineering, resins for surface protection and electronics, lamination resins, moulding compounds, adhesives, and model and tool resins. The term epoxy resins denotes organic compounds containing more than one epoxide group (IUPAC: oxirane group) per molecule which are employed for obtaining polymers. They are all low-molecular-weight or oligomeric compounds.

The build-up of polymers by the epoxy resin polyaddition process is based on the characteristic behaviour of epoxide groups of reacting with corresponding reaction partners with adduction. The di-, tri- and tetraepoxide compounds Commercial products are those from the Araldit (Ciba-Geigy), Beckopox (Hoechst), D.E.R. (Dow), Epikote (Shell), Epodil (Anchor), Eponac (AMC Sprea Resine), Epotuf (Reichhold), Eurepox (Witco), Grilonit (Ems-Chemic), Kelpoxy (Reichold), Resox (Synthopol), Rutapox (Bakelite) and Ucar phenoxy resin (Union Carbide) series. Examples of isocyanates are the following:

Solid resins of blocked isocyanates, such as Crelan VP LS 2147 (polyester containing uretdione groups), Crelan VP LS 2292 (dimethylpyrrole-blocked IPDI), wherein IPDI is isophorondiisocyanate, Vestanat B 1358/100 (2-butanone oxime-blocked IPDI), Desmodur IL (an aromatic polyisocyanate based on toluene diisocynate and dissolved in n-butyl acetate) or Desmodur H (hexamethylene diisocyanate). Crelan® serves, inter alia, as binder and crosslinking agent based on polyesters and polyacrylates in combination with masked isocyanates for the production of sprayable powder coatings. The manufacturer is Bayer AG. The crosslinking agent Crelan® VP LS 2147 is a blocking agent-free curing agent for polyurethane coatings. Crelan VP LS 2147 is based on uretdione chemistry. Through dimerization by means of suitable catalysts, the isocyanate groups can be deactivated reversibly. The isocyanate functions are only re-liberated at elevated temperatures, and are then able to react to completion with no emissions. In contrast to systems in which caprolactam-blocked polyisocyanates are used for the crosslinking, this uretdione crosslinking agent does not cause any emissions of blocking agents and also does not eliminate any water during the crosslinking reaction. The curing agent is toxicologically acceptable and is therefore not subject to a labelling requirement.

Polyvinylbutyrals in which R=—$CH_2$—$CH_2$—$CH_2$—$CH_3$ in the formula

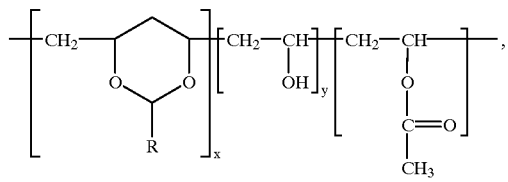

have lower strengths than polyvinylformal and are softer and more extensible. They are soluble in lower alcohols, glycol ethers and alcohol/aromatic mixtures and insoluble in pure aliphatics. Polyvinylbutyrals consist both of hydrophobic and hydrophilic monomer units. While the hydrophobic vinylbutyral units effect thermoplastic processability, solubility in many solvents, compatibility with other polymers and plasticizers and good mechanical properties, the vinyl alcohol units are responsible for the good adhesion to glass, wood and metals, the high strength, the high pigment binding capacity and the crosslinkability. With increasing vinyl alcohol content, the strength and modulus of elasticity, as well as the glass transition temperature increase. The proportion of vinyl alcohol units is between 15 and 30 percent by weight and that of vinyl acetate units is between 1 and 3 percent by weight. Commercial products made from polyvinylbutyral are, for example: Butvar (Monsanto), Denka Butyral (Denki Kagaku), Mowital (Hoechst), Pioloform (Wacker), Rhovinal (Rhone Poulenc), S-Lec-B (Sekisui) and Vinylite (Union Carbide).

Preferably 1–20%, more preferably 7–12%, of a monohydric $C_1$-$C_{20}$-alkanol, preferably of a $C_3$-$C_{18}$-alkanol, and/or of a polyhydric $C_3$-$C_{12}$-alkanol (such as glycerol, propanediol, ethoxy(ethoxy)ethanol, Cellosolv or carbitol), of a tetrose, pentose or hexose (such as erythritol, arabinose or glucose), of a hydrogenated derivative thereof (such as sorbitol, arabitol or mannitol) or benzoate can be added to the polymer composition, based on the total weight.

The thermal transfer ribbon used for the process has a coating weight in the range from 0.8 to 5 g/m²±0.2, preferably in the range from 1.6 to 2.0 g/m².

The Wetting Aid

The wetting aid has various functions. The wetting aid is also present at the interface between the metal surface and the transferred polymer after the transfer, so that the adhesion there is increased. Finally, it smoothes the surface of the transferred polymer during fixing, i.e. during subsequent heating of the transferred polymer, so that the structure of the pixel is improved. The wetting aid is selected from solvents, such as alcohols, ketones, esters of phosphoric acid, glycol ethers and anionic surfactants, in particular alcohols and ketones, preferably ketones, particularly preferably methyl ethyl ketone. Commercial products of the above-mentioned solvents are DEGDEE and DEGBBE from BASF as representatives of the glycol ethers, and arylalkylsulfonic acids as representatives of the anionic surfactants, or aliphatic esters of orthophosphoric acid, such as Etingal. The solvents used as wetting aid preferably originate from the thermal transfer ribbon production step.

Wetting aids can be introduced in small amounts (for example 0.05–8% by weight, preferably 0.5–5% by weight, of the dry weight of the donor layer) by the production process. A further advantage of the presence of a wetting aid is intrinsic temperature regulation during the transfer operation and during the thermal aftertreatment. A maximum upper limit temperature is defined for the requisite time window during both operations via the properties boiling point, boiling range, enthalpy of evaporation and heat capacity. For example, microscopic desorption processes in the case of a formulation based on carbon black can set an upper limit temperature. Overheating of the transferred composition may be influenced both by external regulation of the heat sources and by the make-up of the composition itself and thus provides high safety when carrying out the process.

The Process

The thermal transfer ribbon is produced in a conventional manner. In particular, the heat-sensitive or laser light-sensitive substance, the polymer and, if used, a wetting aid and a solvent, where the latter may be identical, are mixed carefully and homogeneously. The composition is then applied using a Meyer bar or by the gravure process. The thickness of the transfer layer is from 0.5 to 5 μm, preferably from 0.8 to 4 μm, in particular from 1 to 3 μm, especially from 1.5 to 2.5 μm, dry layer thickness. After evaporation of the solvent, the ribbon is wound up on a spool and inserted into a ribbon station.

The Function of the Thermal Transfer Film According to the Invention

The pixel transfer unit (a point laser or a semiconductor laser diode array) receives data for the imaging of the printing-plate cylinder from a data store. With the aid of a ribbon station, the thermal transfer ribbon moves relative to a printing cylinder, which itself moves during the transfer operation, but independently. This relative speed and the time sequence of the data control the imaging on the printing cylinder. The incident light energy is converted into heat energy, which causes a particularly great temperature increase at the interfacial layer between the substrate layer and the donor layer of the thermal transfer ribbon. This temperature increase generates gases at the above-mentioned interfacial layer, which fling the now softened material of the donor layer against the metal of the printing-plate cylinder. The substance parts of the transferred material mark the ink-carrying areas on the surface of the printing-plate cylinder during later printing owing to their oleophilic property.

Measurement Method a) The behaviour of a polymer of the donor layer in aqueous alkaline solution is characterized by the following analytical method:

1 g of polymer is dissolved in an aqueous alkaline solution. The amounts of hydroxide solution shown in the table are required for the dissolution:

|  | Hydroxide solution in g for complete dissolution | pH |
| --- | --- | --- |
| Polymer in 0.5 mol/l KOH | 10 | 13 |
| Polymer in 0.1 mol/l NaOH | 50 | 11 |
| Polymer in 0.3 mol/l NaOH | 20 | 13 |

In the present table, the polymer J682 from Johnson S.A. Polymer was employed.

b) The contact angle measurement is carried out using 3+n test liquids. The evaluation is then carried out by the method of Wendt, Own and Rabel. The static surface tension is obtained.

c) The measurement of the glass transition temperature, of the melting range and the determination of the ceiling temperature was carried out using a DSC instrument from Mettler Toledo, DSC30/TSC10A/TC15 with a 150 $\mu$l aluminium beaker containing 20–30 mg of polymer. A temperature rate of 10–20° C./min was used. The following temperature programme was used: begin at least 70 degrees below the expected Tg and end about 50 degrees above the expected Tg or at 180° C. in order to prevent decomposition.

The present invention is explained in greater detail by the following example. Percent, ratio and part data are based on the weight, unless stated otherwise.

EXAMPLE 1

A Hostaphan® polyethylene terephthalate (PET) film from Hoechst having a thickness of 7.5 $\mu$m is coated to a dry layer weight of 1.8 g/m$^2$ with a composition having the following make-up using a Meyer bar.

20% of carbon black having a black value in accordance with DIN 55797 of 250 and 80% of polymer J682 from Johnson S.A. Polymer and an amount of methyl ethyl ketone sufficient to produce a coatable composition are mixed. The composition is applied to the polyester film using a Meyer bar to give the above-mentioned dry layer weight. After the application, the film is dried. In the case of a ribbon having a width of, for example, 12 mm, this is wound up on a spool and inserted into a ribbon station, for example a device as described in EP-B-0 698 488. The back of the thermal transfer ribbon produced in this way is irradiated with an IR semiconductor laser array. During this operation, a plurality of plastic particles are simultaneously transferred imagewise from the thermal transfer ribbon to the printing-plate cylinder. It was possible to print 20,000 copies using the printing cylinder imaged in this way.

EXAMPLE 2

A Hostaphan® polyethylene terephthalate (PET) film from Hoechst having a thickness of 7.5 $\mu$m is coated to a dry layer weight of 1.8 g/m$^2$ with a composition having the following make-up using a Meyer bar.

4.52 g of Conductex having a black value in accordance with DIN 55797 of 250 and 13.19 g of polymer J682 from Johnson S.A. Polymer, 2.39 g of Crelan VP LS 2147, 0.54 g of Triton X200, 0.22 g, of phosphoric acid (85%) and 79.47 g of methyl ethyl ketone are mixed. The composition is applied to the polyester film using a Meyer bar to give the above-mentioned dry layer weight. After the application, the film is dried. In the case of a ribbon having a width of, for example, 12 mm, this is wound up on a spool and inserted into a ribbon station, for example a device as described in U.S. Pat. No. 5,601,022. The back of the thermal transfer ribbon produced in this way is irradiated with an IR semiconductor laser array. During this operation, a plurality of plastic particles are simultaneously transferred imagewise from the thermal transfer ribbon to the printing-plate cylinder. It was possible to print 20,000 copies using the printing cylinder imaged in this way.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A printing plate comprising a surface which has been imaged by laser-induced transfer with a composition comprising a substance which is able to convert radiation energy of incident laser light into heat energy, a polymer which contains at least one of acidic groups and unsubstituted or substituted amide groups of said acidic groups, and a wetting aid, wherein said substance comprises at least one of
   a) one of an organic dye and an organic colorant having at least one of an absorption maximum in the wavelength range from 700 to 1600 nm, and a heat resistance of greater than 150° C.;
   b) an inorganic substance which is able to convert radiation energy into heat energy without decomposing, and
   c) a type of carbon, wherein said polymer comprises 1–20% reactive polymer consisting of one of an epoxide, an isocyanate, and polyvinyl butyral.

2. A printing plate according to claim 1 wherein said surface is one of a plasma sprayed ceramic, a flame sprayed ceramic, and a metal.

3. A printing plate as in claim 2 wherein said surface is a metal selected from the group including chrome, brass (Cu52–65% Zn48–35%), and stainless steels in accordance with DIN 17440.

4. A printing plate as in claim 1, wherein the reactive polymer is polyvinyl butyral.

5. A printing plate as in claim 1, wherein said polymer comprises 7–12% reactive polymer.

6. A printing plate as in claim 1, wherein said reactive polymer is a solid.

7. A printing plate according to claim 1, wherein said one of said organic dye and said organic colorant comprises one of heat-stable organic dyes and pigments selected from benzothiazoles, quinolines, cyanine dyes or pigments, perylene dyes or pigments and polymethine dyes or pigments.

8. A printing plate according to claim 1, wherein the inorganic substance is selected from $TiO_2$, $Al_2O_3$, magnetite $Fe_3O_4$; spinel black: $Cu(Cr,Fe)_2O_4$, $Co(Cr,Fe)_2O_4$, and manganese ferrite $MnFe_2O_4$.

9. A printing plate according to claim 1, wherein the carbon is selected from a carbon black having a mean particle size of from 5 to 100 nm.

10. A printing plate according to claim 9, wherein the carbon black has a black value in accordance with DIN 55979 of between 200 and 290.

11. A printing plate according to claim 1, wherein the polymer of the donor layer contains at least one of acidic groups selected from —COOH, —SO$_3$H, —OSO$_3$H and —OPO$_3$H$_2$, and amide groups which are unsubstituted or substituted by C$_1$–C$_6$-alkyl- or C$_6$–C$_{10}$-aryl radicals.

12. A printing plate according to claim 1, wherein the polymer of the donor layer dissolves in water at a pH of greater than 10.

13. A printing plate according to claim 1, wherein the polymer of the donor layer has a number average molecular weight of from 1000 to 20,000.

14. printing plate according to claim 1, wherein the polymer of the donor layer has a surface tension of from 50 to 20 mN/m, determined by contact angle measurement.

15. A printing plate according to claim 1, wherein the polymer of the donor layer has a glass transition temperature in the range from 30 to 100° C.

16. A printing plate according to claim 1, wherein the polymer of the donor layer has a ceiling temperature in the melting point range for all components between 80 and 150° C.

17. A printing plate according to claim 1, wherein the wetting aid is selected from organic solvents which are capable of dissolving said polymer which contains at least one of acidic groups and unsubstituted or substituted amide groups of said acidic groups.

18. A printing plate according to claim 17, wherein the solvent is a ketone.

19. A printing plate according to claim 17, wherein the solvent is present in an amount which is sufficient so that, after transfer of the polymer of the donor layer onto the printing plate, evaporation of the solvent results in intrinsic temperature regulation during a fixing step under the action of heat over the period of the action of heat.

20. A printing plate according to claim 1, wherein the reactive polymer is an epoxide, and the epoxide is a solid resin based on bisphenol A.

21. A printing plate according to claim 1, wherein the reactive polymer is an isocyanate, and the isocyanate is one of blocked isocyanate, a polyester containing uretdione groups, a dimethylpyrrole-blocked IPDI, a 2-butanone oxime-blocked IPDI, (an aromatic polyisocyanate based on toluene diisocynate and dissolved in n-butyl acetate) and (hexamethylene diisocyanate).

22. A printing plate as in claim 7, wherein said one of an organic dye and an organic colorant comprises at least one of oxanol dyes and pigments and merocyanine dyes and pigments.

* * * * *